United States Patent [19]

Kojima

[11] Patent Number: 4,588,905
[45] Date of Patent: May 13, 1986

[54] DIGITAL WAVEFORM CONDITIONING CIRCUIT

[75] Inventor: Tadashi Kojima, Yokosuka, Japan

[73] Assignee: Tokyo Shibaura Denki Kabushiki Kaisha, Kawasaki, Japan

[21] Appl. No.: 699,233

[22] Filed: Feb. 8, 1985

Related U.S. Application Data

[63] Continuation of Ser. No. 363,627, Mar. 30, 1982, abandoned.

[30] Foreign Application Priority Data

Apr. 16, 1981 [JP] Japan .................. 56-57560

[51] Int. Cl.$^4$ ............ H03K 5/13; H03K 12/00; H03K 5/153
[52] U.S. Cl. .................. 307/269; 307/268; 307/352; 307/358; 307/603; 328/162
[58] Field of Search ......... 307/350, 352, 353, 356, 307/358, 359, 603, 516, 269, 268; 328/162, 164

[56] References Cited

U.S. PATENT DOCUMENTS

| | | | |
|---|---|---|---|
| 3,239,694 | 3/1966 | Rovell . | |
| 3,375,450 | 3/1968 | Ayres et al. | 328/150 |
| 3,473,131 | 10/1969 | Perkins | 328/164 |
| 3,584,310 | 6/1971 | Hochfelder | 307/350 |
| 3,708,678 | 2/1973 | Kreda | 330/24 |
| 3,772,604 | 11/1973 | Hogg et al. | 328/169 |
| 4,241,455 | 12/1980 | Eibner | 307/358 |
| 4,281,317 | 7/1981 | Pace | 307/350 |
| 4,406,988 | 9/1983 | Scholz | 307/358 |

FOREIGN PATENT DOCUMENTS

| | | |
|---|---|---|
| 2141772 | 6/1972 | France . |
| 2182855 | 2/1973 | France . |
| 131324 | 6/1978 | German Democratic Rep. . |
| 2017365 | 3/1979 | United Kingdom . |

OTHER PUBLICATIONS

Translation of Spring.
Viles, "Upper & Lower Thresholds Can Be Set Independently in Latching-Comparator Circuit", Electronic Design, 12/30/77.
Analog and Digital Communication, pp. xvii and 387, 388, 389, 1977, W. David Gregg, John Wiley & Sons, New York.

Primary Examiner—Stanley D. Miller
Assistant Examiner—Timothy P. Callahan
Attorney, Agent, or Firm—Finnegan, Henderson, Farabow, Garrett & Dunner

[57] ABSTRACT

A digital waveform conditioning circuit for restoring a deformed digital signal into its original rectangular waveform, comprising an input terminal supplied with the deformed digital signal, a circuit for generating a reference signal by combining positive and negative voltage components rectified from positive and negative cycles of the deformed signal, a comparator for comparing the deformed signal with the reference signal, a circuit for holding an output signal of the comparator for a period controlled by a clock signal for synchronizing the output signal with the original rectangular signal, and an output terminal for receiving the output of the holding circuit.

8 Claims, 2 Drawing Figures

DIGITAL WAVEFORM CONDITIONING CIRCUIT

This application is a continuation, of application Ser. No. 363,627, filed Mar. 30, 1982 now abandoned.

BACKGROUND OF THE INVENTION

This invention relates to a digital waveform conditioning circuit for processing a digital signal.

Recently, progress has been made in the technique of processing a digital signal. Analog signals such as audio signals are recorded after being converted into digital signals such as pulse code modulation (PCM) signals. Also, in the field of signal transmission, digital signals are processed. In this connection it will be noted that reproduced or transmitted digital signals cease to have a perfect rectangular waveform since they are deteriorated by the signal to noise (S/N) ratio or frequency characteristic of the recording or transmission system. Therefore, it is necessary to carry out waveform conditioning of the digital signals obtained in order to restore the rectangular waveform of the original signals.

A digital waveform conditioning circuit generally comprises a comparator for comparing the level of an input signal with a predetermined reference value and a holding circuit for reading an output signal from the comparator in response to a clock signal and for holding the fetched signal.

When, however, an input signal includes noise, it sometimes happens that an output signal from the comparator ceases to denote a code corresponding to that of the original rectangular signal and is decoded in the wrong audio signal. Such conditioning error is detrimental in the processing of a digital rectangular signal. Further, the rectangular waveform of a digital signal has an extremely broad frequency spectrum. Consequently, the digital signals should have a broad frequency characteristic to assure proper recording, reproducing or transmission, and also to assure that the signals are recorded, produced, or transmitted with greater density. However, the S/N ratio and frequency characteristic of the recording, reproducing, and transmission systems generally becomes less satisfactory in the higher frequency regions. When, therefore, digital signals are recorded, reproduced or transmitted with higher density, the percentage occurrence of errors tends to increase.

SUMMARY OF THE INVENTION

It is therefore the principal object of this invention to reduce the rate of decoding errors in processing digital signals in a digital waveform conditioning circuit.

To attain the above-mentioned object, the digital waveform conditioning circuit of the invention comprises an input terminal for receiving a signal deformed from a digital rectangular signal, the deformed signal having alternating positive and negative cycles, a circuit for generating a reference signal produced by combining the positive and negative components rectified from the positive and negative cycles of the deformed digital signal, a comparator for making a comparison between the deformed digital signal and the reference signal, a circuit for holding the output signal of the comparator for a period controlled by a clock signal synchronizing the output signal with the original rectangular signal.

DESCRIPTION OF THE PREFERRED EMBODIMENT

The present invention will be described in detail with reference to the accompanying drawings FIGS. 1 and 2.

Figure 1:
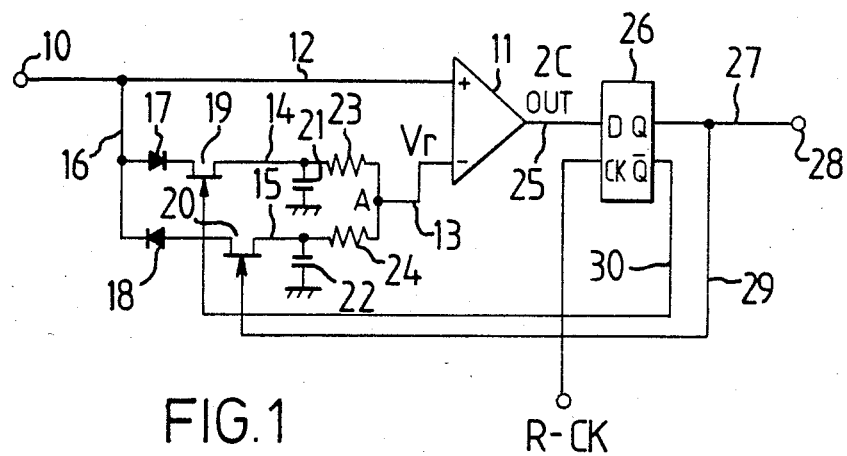
FIG. 1 shows the arrangement of a digital waveform conditioning circuit according to one embodiment of this invention.

In FIG. 1 is shown a circuit arrangement according to the present invention for conditioning digital waveforms, deformed in the course of signal processing, into their original shape. Input terminal 10 of the circuit receives signals from a reproduction circuit (not shown). The non-inverting input of comparator 11 is directly connected with input terminal 10 via line 12. The inverting input of comparator 11 is connected to input terminal 10 by way of line 13, parallel lines 14 and 15 and a branch line 16 of line 12.

Diodes 17 and 18, acting as rectifiers, are inserted in lines 14 and 15 in such a manner that only the positive voltages from input terminal 10 can reach one of lines 14 and 15 and only negative voltages can reach the other. FETs 19 and 20, for sampling the positive and negative voltages, as the case may be, are inserted in lines 14 and 15, the sources of the FETs receiving voltages through the respective diodes. For purposes of illustration FET 19 is shown as sampling the positive voltages and FET 20 as sampling the negative voltages. The FETs 19 and 20 in effect act as analog switches.

Capacitors 21 and 22, for storing the sampled positive and negative voltages, are connected at the drains of the FETs 19 and 20 between respective lines 14 and 15 and ground. Resistors 23 and 24, for combining the voltages stored in respective capacitors 21 and 22, are inserted in line 14 and 15, respectively, with a node A between them connected to line 13.

Line 25 connects the output of comparator 11 to an input terminal of a holding means, for example, the "D" input of "D" type flip-flop 26. The clock terminal of flip-flop 26 is supplied a clock signal synchronized with the original digital rectangular signal from a clock signal generator (not shown) via terminal R-CK. The flip-flop 26 holds the previous logic state of its "D" input signal until a rising of clock signal CK occurs after the logic state is reversed. The Q output of "D" type flip-flop 26 is supplied over line 27 to output terminal 28 and over line 29 to the control terminal of FET 20 for sampling the negative voltage. The $\overline{Q}$ output of "D" type flip-flop 26 is supplied over line 30 to the control terminal of FET 19 for sampling the positive voltage.

The function of the above-described circuit arrangement is explained below with reference to FIGS. 1 and 2.

Figure 2:
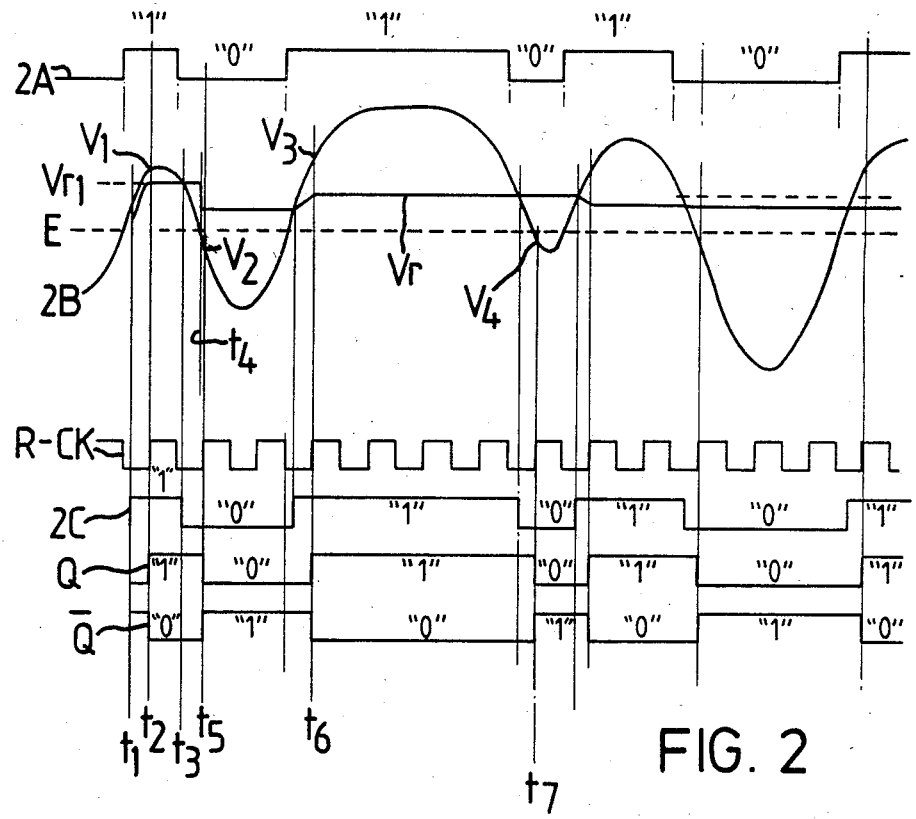
FIG. 2 shows time charts illustrating the operation of the embodiment of FIG. 1.

A reproduction circuit (not shown) supplies to input terminal 10 a deformed digital signal as graph 2B shown in FIG. 2. The deformed digital signal of graph 2B is assumed to be rounded from its original rectangular waveform of the PCM signal shown as graph 2A. Now let it be assumed that before the deformed digital signal 2B is applied to the input terminal 10 the voltage on the connection node A of resistors 21 and 22 is at ground voltage E. Also it is assumed that ground voltage E substantially coincides with the mean voltage of the deformed digital signal 2B, as is apparent to one skilled in the art. Before the application of the deformed digital signal of the input terminal 10, the mean voltage, hereinafter referred to as reference voltage Vr, is at ground level.

If the deformed digital signal 2B is applied to input terminal 10 at a time $t_1$, the output 2C of comparator 11 turns into the logic "1". The reference voltage Vr gradually increases above ground voltage E, as a positive part of the deformed digital signal 2B, rectified by diode 17, is stored into capacitor 21. At a time $t_2$ when the clock pulse R-CK applied to clock terminal CK of "D" flip-flop 26 rises, the Q output of "D" flip-flop 26 turns into the logic "1". At the same time, the $\overline{Q}$ output becomes the logic "0" so that FET 19 assumes its OFF state. Accordingly, the reference voltage Vr is kept at a stored voltage Vr1 in capacitor 21 at the time $t_2$.

At a time $t_3$, when the deformed digital signal 2B goes below the voltage Vr1, the output 2C becomes logic "0". However, the Q and $\overline{Q}$ outputs are kept at the logics "1" and "0", respectively. At a time $t_4$ when the deformed digital signal 2B becomes below ground voltage E, a negative part of the deformed digital signal 2B is rectified by diode 18 and stored into capacitor 22 through FET 20 as the logic "1". Accordingly, the reference voltage Vr as of the voltage on the connection node A between resistors 23 and 24 gradually decreases from the voltage Vr1.

At a time $t_5$ when the clock pulse R-CK rises, the Q and $\overline{Q}$ outputs turn into the logics "0" and "1", respectively. Therefore, the reference voltage Vr becomes the mean voltage of the positive stored voltage in capacitor 21 at the time $t_2$ and the negative stored voltage in capacitor 22 at the time $t_5$.

The reference voltage Vr will be varied by the succeeding positive and negative voltages stored in capacitors 21 and 22, and will be adjusted to a voltage capable of being crossed by the reaching deformed digital signal 2B any positive and negative peak as along as there are sufficient voltage differences between the peaks.

Generally, every peak of the deformed digital signal appearing on the non-inverted input terminal of comparator 11 in every time frame has a height such that the signal crosses the reference voltage appearing on the inverted input terminal of comparator 11 at the proper time. The probability that a peak of the deformed digital signal will fail to cross the reference voltage is in the very low order of $10^{-5}$.

Therefore, comparator 11 can operate for both positive and negative peaks of the deformed digital signal 2B and outputs the rectangular waveform signal 2C of which the logic states "1" and "0" are accurately corresponding to the positive peaks and negative peaks of the deformed digital signal 2B.

As shown in FIG. 2, comparator output 2C takes a logic "1" during the voltage of deformed digital signal 2B applied to the non-inverting input of comparator 11 via line 12 when the voltage is higher than reference voltage Vr. On the other hand, comparator output 2C takes a logic "0" during deformed digital signal 2B which in lower than reference voltage Vr. Comparator output 2C is applied to the "D" input of "D" type flip-flop 26, as stated above. "D" type flip-flop 26 produces outputs shown as graphs Q and $\overline{Q}$ terminals. The Q output takes the same logic value as is applied to the "D" input on every instance when the succeeding clock pulse applied to the clock input CK rises. Therefore, changes in the logic states "1" and "0" of the Q output are late, as compared with those of comparator output 2C between change and time of occurrence of the first rising of a clock pulse after the logic changes of the output 2C of the comparator 11. The $\overline{Q}$ output of course, takes a logic value opposite to Q output.

The $\overline{Q}$ output is applied to the gate of FET 19 through line 30 so that FET 19 is shut off during the "0" logic state of the $\overline{Q}$ output as stated above. Accordingly, the chargings of capacitor 21 by current through diode 17 is interrupted at every timing $t_2$, $t_6$ etc when $\overline{Q}$ output goes down to "0" logic state. On the other hand, Q output is applied to the gate of FET 20 through line 29 so that FET 20 is shut off during the "0" logic state of the Q output. Accordingly, the charging of capacitor 22 by current through diode 18 is interrupted at every timing $t_5$, $t_7$, etc., when the output goes down to "0" logic state.

As a result, voltages $V_1$, $V_2$, $V_3$, $V_4$, etc., of deformed digital signal 2B at the timings $t_2$, $t_5$, $t_6$, $t_7$, etc., are sampled by FETs 19 and 20 and stored in capacitors 21 and 22, as this may be. Positive voltages $\overline{V}_1$, $\overline{V}_3$ etc on capacitor 21 and negative voltages $\overline{V}_2$, $\overline{V}_4$ etc on capacitor 22 are combined with each other continuously through resistors 23 and 24 so that reference voltage Vr is adjusted to the proper voltage as stated above.

With the digital waveform conditioning circuit according to the above embodiment of this invention, in spite of the fact that the deformed digital signal 2B has positive and negative peaks with various heights, relatively small positive and negative voltages on the waveform of the deformed digital signal 2B are sampled. So that the reference voltage Vr varies relatively gently, thereby producing the following effect. Namely, the reference voltage Vr is scarcely affected by larger peaks of deformed digital signal 2B so that the reference voltage Vr is capable of crossing with the smallest peaks of the deformed digital signal 2B. Further, in the case that the range in which the smallest positive and negative peaks of the deformed digital signal 2B are included is biased upward or downward from the center of the deformed digital signal 2B, the reference voltage 2B is adjusted to the proper voltage with the range.

As a result, every peak of the deformed digital signal 2B is converted to the logic "1" or logic "0" state rectangular waveform signal in the signal 2C by comparator 11. And the signal 2C is converted to the Q output signal which is a signal synchronized with and same as the original rectangular digital signal 2A.

What is claimed is:

1. A digital waveform conditioning circuit which comprises: an input terminal for receiving a signal deformed from a digital rectangular signal, said deformed digital signal having alternating positive and negative cycles;
    means for generating a reference signal produced by combining positive and negative components rectified from the positive and negative cycles of the deformed digital signal;
    means for comparing said deformed digital signal with said reference signal;
    means for holding an output signal of said comparing means for a period controlled by a clock signal synchronizing said output signal of said holding means with said digital rectangular signal; and
    an output terminal for receiving the output signal from said holding means.

2. A digital waveform conditioning circuit according to claim 1, wherein said holding means includes inverted and non-inverted outputs with one of said outputs connected to said output terminal and wherein said reference signal generating means comprises:
- individual means for sampling the positive and negative cycles of said deformed digital signals under the control of said inverted and non-inverted outputs of said holding means.

3. A digital waveform conditioning circuit according to claim 2, wherein said individual sampling means comprise first and second analog switching means, each having a pair of main current-carrying terminals and a control terminal, the control terminals being individually connected to different ones of said inverted and non-inverted outputs; and wherein said reference signal generating means further comprises:
- first and second diodes connected between said input terminal and individual ones of said pair of current-carrying terminals, said diodes being connected in opposite polarity to said input terminal;
- first and second capacitors individually connected between the other ones of said pair of current-carrying terminals and ground for storing voltages applied by said first and second analog switching means; and
- first and second resistors each having one terminal connected to individual ones of said capacitors and the other terminals connected together for combining voltages stored on said first and second capacitors, said combined voltages forming said reference signal.

4. A digital waveform conditioning circuit according to any one of claims 1 to 3, wherein said holding means is a D type flip-flop.

5. A digital waveform conditioning circuit which comprises:
- an input terminal for receiving a signal deformed from a digital rectangular signal, said deformed digital signal having alternating positive and negative cycles;
- means for rectifying said deformed signal;
- means connected to said rectifying means for generating a reference signal produced by combining positive and negative components rectified from the positive and negative cycles of the deformed digital signal;
- means for comparing said deformed digital signal with said reference signal;
- means for holding an output signal of said comparing means for a period controlled by a clock signal synchronizing said output signal of said holding means with said digital rectangular signal; and
- an output terminal for receiving the output signal from said holding means.

6. A digital waveform conditioning circuit according to claim 5, wherein said holding means includes inverted and non-inverted outputs with one of said outputs connected to said output terminal and wherein said reference signal generating means comprises;
- individual means for sampling the positive and negative cycles of said deformed digital signals under the control of said inverted and non-inverted outputs of said holding means.

7. A digital waveform conditioning circuit according to claim 6:
- wherein said individual sampling means comprise first and second analog switching means, each having a pair of main current-carrying terminals and a control terminal, the control terminals being individually connected to different ones of said inverted and non-inverted outputs;
- wherein said rectifying means comprises first and second diodes connected between said input terminal and individual ones of said pair of current-carrying terminals, said diodes being connected in opposite polarity to said input terminal; and
- wherein said reference signal generating means further comprises:
- first and second capacitors individually connected between the other ones of said pair of current-carrying terminals and ground for storing voltages applied by said first and second analog switching means; and
- first and second resistors each having one terminal connected to individual ones of said capacitors and the other terminals connected together for combining voltages stored on said first and second capacitors, said combined voltages forming said reference signal.

8. A digital waveform conditioning circuit according to any one of claims 5 to 7, wherein said holding means is a D type flip-flop.

* * * * *